(12) United States Patent
Yamanashi et al.

(10) Patent No.: US 7,679,056 B2
(45) Date of Patent: Mar. 16, 2010

(54) METROLOGY SYSTEM OF FINE PATTERN FOR PROCESS CONTROL BY CHARGED PARTICLE BEAM

(75) Inventors: Hiromasa Yamanashi, Sagamihara (JP); Muneyuki Fukuda, Kokubunji (JP); Sayaka Tanimoto, Palo Alto, CA (US); Yasunari Sohda, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 280 days.

(21) Appl. No.: 11/687,002

(22) Filed: Mar. 16, 2007

(65) Prior Publication Data
US 2007/0221844 A1 Sep. 27, 2007

(30) Foreign Application Priority Data
Mar. 23, 2006 (JP) .............................. 2006-081456

(51) Int. Cl.
*H01J 27/02* (2006.01)
*G01R 31/26* (2006.01)

(52) U.S. Cl. .................. 250/310; 250/311; 250/423 F; 250/424

(58) Field of Classification Search .................. None
See application file for complete search history.

(56) References Cited

U.S. PATENT DOCUMENTS

| | | | | |
|---|---|---|---|---|
| 4,014,772 A | * | 3/1977 | Woods et al. | 204/192.22 |
| 4,864,228 A | * | 9/1989 | Richardson | 324/751 |
| 6,633,831 B2 | * | 10/2003 | Nikoonahad et al. | 702/155 |
| 2004/0211899 A1 | | 10/2004 | Ezumi et al. | |
| 2008/0129209 A1 | * | 6/2008 | Deakins et al. | 315/111.91 |

FOREIGN PATENT DOCUMENTS

WO   WO 03/007330 A1   1/2003

* cited by examiner

*Primary Examiner*—David A Vanore
(74) *Attorney, Agent, or Firm*—Antonelli, Terry, Stout & Kraus, LLP.

(57) ABSTRACT

The present invention provides a pattern inspection technique that enables measurement and inspection of a fine pattern by a charged particle beam to be performed with high throughput. A metrology system of fine pattern according to the pattern inspection technique has: a the column that includes a charged particle source, an electron optics for scanning a desired observation area on a sample with a charged particle beam emitted from the charged particle source, and a detector for detecting charged particles generated secondarily from the sample scanned by the charged particle beam; information processing means for measuring information about geometry of a pattern formed on the sample based on information on the intensity of the charged particles obtained by the detector; and a sample introduction unit for introducing the sample into the inside of the column; wherein a charge neutralizer unit for generating ions and charge neutralizing the sample with the ions and surface potential measuring means for measuring a surface potential of the sample surface are provided on a path that is inside the sample introduction unit and transports the sample to the column.

4 Claims, 12 Drawing Sheets

DISTANCE FROM THE CENTER OF WAFER (mm)

METROLOGY SYSTEM OF FINE PATTERN FOR PROCESS CONTROL BY CHARGED PARTICLE BEAM

CLAIM OF PRIORITY

The present invention claims priority from Japanese application JP 2006-81456 filed on Mar. 23, 2006, the content of which is hereby incorporated by reference on to this application.

BACKGROUND OF THE INVENTION

The present invention relates to a technique for measuring geometry of a fine pattern on the surface of a sample (a semiconductor wafer, a reticle, etc.) and its dimensions.

Currently, the use of a critical-dimension scanning electron microscope (hereinafter abbreviated to as CD-SEM) is a mainstream in measuring dimensions of a semiconductor device pattern. The structure of the CD-SEM is fundamentally the same as that of the scanning electron microscope. First, electrons emitted from an electron source of a heating type or field emission type are accelerated. Subsequently, an electron beam is converged in diameter by a lens to form a focused electron beam. Then, the electron beam is scanned on a sample (e.g., a wafer, a reticle, etc.) and generated secondary electrons are detected, whereby a two-dimensional scanning electron image of the fine pattern on the sample can be obtained. In doing this, if the primary electrons scanned on the sample have larger landing energies, a generation efficiency of the secondary electrons becomes smaller than unity, and accordingly the sample will tend to be charged up. Therefore, it is required that landing energy should be made as small as possible. Moreover, since materials that are newly introduced into a process include ones that are weak against the electron beam, it is mandatory to lower the energy of incident electrons in this respect. However, this requirement conflicts with achievement of higher resolution of the CD-SEM demanded along with miniaturization of a circuit pattern. Therefore, a metrology system is equipped with a mechanism whereby an accelerating voltage after generation of electrons from the electron source is set somewhat higher and subsequently a deceleration voltage is impressed on the electrons (impression of a retarding voltage) before the electrons are incident on the sample. With this mechanism, the metrology system can realize compatibility between higher resolution of an obtained image and reduction in charge-up of the sample.

However, in recent years, some samples with charge-up have begun to exist among samples under measurement. It is discovered that the charge-up of the sample and its distribution cause focusing error, astigmatism, etc. of the CD-SEM. Causes of charged-up samples are considered to lie in plasma etching processing and a resist application process, but they cannot explain all causes of the charge-up. One way or another, the charge-up in concern comes from charges caused by fixed charges that remain even when the sample is grounded. If such charge-up exists, a trajectory of the charged particle to be incident on the sample will be changed, and a focusing position of the incident electron beam will be shifted from the surface of the sample. As a result, a focusing position is shifted, which requires a time for adjusting the focusing position, causing throughput to be reduced. Moreover, when the above-mentioned amount of charge-up has an in-plane distribution, each time the position at which the measurement is conducted on a sample moves, the focusing adjustment as described above becomes necessary.

Against such problems, PCT International Publication WO 2003/007330 discloses the following technique. First, a wafer is taken out from a wafer cassette that carries wafers by a mechanical arm for wafer transportation of an atmosphere-side robot, and is transported to a load lock chamber. When the wafer is transported to this load lock chamber, a surface potential of the wafer is measured with a probe. Since in often cases, the wafer is charged up in the form of concentric circles, if a part of the probe that measures the surface potential traces on a straight line passing through the wafer center, a rough potential distribution on the whole surface of the sample will be able to be grasped.

Therefore, it becomes possible to correct focusing by measuring the surface potential of the sample beforehand with the above-mentioned probe before the measurement of dimensions of the fine pattern, and feeding back the value to the retarding voltage.

SUMMARY OF THE INVENTION

However, if a surface potential estimated beforehand contains a large error or if rotational symmetry of the in-plane distribution of the surface potential of the sample is low, it will take time to adjust a retarding voltage, which will cause throughput of a metrology system to be reduced. Moreover, regarding astigmatism, simple impression of the corrected retarding voltage has no effect at all, and the problem remains not solved. In order to measure the sample at a plurality of positions, it is necessary to adjust the astigmatism automatically each time the stage is moved, which also causes the throughput of the measurement to be lowered.

As described above, the conventional method for measuring a fine pattern using a CD-SEM bears a problem that the throughput lowers for a charged-up sample.

The object of the present invention is to address the above-mentioned problem and provide a charged particle beam pattern measurement technique that makes possible a high-accuracy measurement with high throughput at all measurement points.

In order to attain the object, a metrology system of fine pattern for process control by charged particle beam of the present invention has characteristics described below.

(1) A metrology system of fine pattern for process control by charged particle beam, has: a column that includes a charged particle source, an electron optics for scanning a desired observation area on the sample using a charged particle beam emitted from the charged particle source, and a detector for detecting charged particles generated secondarily from the sample scanned by the charged particle beam; information processing means for measuring information about geometry of a pattern formed on the sample based on information on the intensity of the charged particles obtained by the detector; and a sample introduction unit for introducing the sampled into the inside of the column; wherein a charge neutralizer unit for generating ions and charge neutralizing the sample with the ions and surface potential measuring means for measuring the surface potential of the sample surface are provided on a path that is inside the sample introduction unit and transports the sample to the column.

(2) In the metrology system of fine pattern for process control by charged particle beam as set forth in the (1), the charge neutralizer unit is installed to place above a rotation stage allowing the sample to be placed and held thereon and capable of rotation with the sample provided on the sample transportation path.

(3) In the metrology system of fine pattern for process control by charged particle beam as set forth in the (1), the charge neutralizer unit is installed at a position whose distance is not more than one half times the radius of the wafer as the sample to the sample mount plane of the rotation stage.

(4) A metrology system of fine pattern for process control by charged particle beam, has: a column that includes a charged particle source, an electron optics for scanning a desired observation area of the sample using a charged particle beam emitted from the charged particle source, and a detector for detecting charged articles generated secondarily from the sample scanned by the charged particle beam; information processing means for measuring information about geometry of a pattern formed on the sample based on information on the intensity of the charged particles obtained by the detector; and a sample introduction unit for introducing the sample into the inside of the column; wherein soft x-ray irradiating means for charge neutralizing the sample by irradiating soft x-ray onto the sample and the surface potential measuring means for measuring the surface potential of the sample surface are provided on a path that is inside the sample introduction unit and transports the sample to the column.

(5) In the metrology system of fine pattern for process control by charged particle beam as set forth in the (4), the soft x-ray irradiating means has a plurality of soft x-ray irradiators and a rotation stage allowing the sample to be placed and held thereon and capable of rotation with the sample, and the metrology system is so configured that the plurality of soft x-ray irradiators may be installed above the rotation stage.

(6) In the metrology system of fine pattern for process control by charged particle beam as set forth in the (5), the plurality of soft x-ray irradiators are placed with respective different distances from the center of the rotation stage and are installed at positions of respective different heights to a sample mount plane of the rotation stage.

(7) In the metrology system of fine pattern for process control by charged particle beam as set forth in the (5), among the plurality of soft x-ray irradiators, a soft x-ray irradiator placed at short distance from the center of the rotation stage is installed at a higher position to a sample mount plane of the rotation stage than a soft x-ray irradiator placed at long distance from the center of the rotation stage.

(8) In the metrology system of fine pattern for process control by charged particle beam as set forth in the (4), the surface potential measuring means has at least one static probe and is configured to determine irradiation times of the plurality of soft x-ray irradiators using a measurement result by the at least one static probe.

(9) In the metrology system of fine pattern for process control by charged particle beam as set forth in the (4), the surface potential measuring means has two static probes on a path that is inside the sample introduction unit and transports the sample to the column, the two static probes being installed in previous and subsequent stages of the soft x-ray irradiating means, respectively, and the metrology system is configured to determine an irradiation time of soft x-ray of the soft x-ray irradiating means using a measurement result by the static probe installed in the previous stage and is configured to determine focusing of the charged particle beam using a measurement result by the static probe placed in the subsequent stage.

(10) A metrology system of fine pattern for process control by charged particle beam, has: a column that includes a charged particle source, an electron optics for scanning a desired observation area on a wafer sample using a charged particle beam emitted from the charged particle source, and a detector for detecting charged particles generated secondarily from the sample scanned by the charged particle beam; information processing means for measuring information about geometry of a pattern formed on the sample based on information on the intensity of the charged particles obtained by the detector; and a sample introduction unit for introducing the sample into the inside of the column; wherein charge neutralizing means for charge neutralizing the sample by impressing a voltage on a plurality of electrodes and the surface potential measuring means for measuring the surface potential of the sample surface are provided on a path that is inside the sample introduction unit and transports the sample to the column.

(11) In the metrology system of fine pattern for process control by charged particle beam as set forth in the (10), the charge neutralizing means has a rotation stage allowing the sample to be placed and held thereon and capable of rotation with the sample, and the plurality of electrodes are so arranged that each inter-electrode distance may be equal to the length of a radius of the sample.

(12) In the metrology system of fine pattern for process control by charged particle beam as set forth in the (11), among the plurality of electrodes, the electrode placed at the center of the rotation stage and the electrode placed in surrounding of the center are impressed voltages of different polarities, respectively.

(13) In the metrology system of fine pattern for process control by charged particle beam as set forth in the (10), the surface potential measuring means has at least one static probe, and impressed voltages and impression times of the plurality of electrodes are determined using a measurement result by the at least one static probe.

(14) In the metrology system of fine pattern for process control by charged particle beam as set forth in the (10), the surface potential measuring means has two static probes on a path that is inside the sample introduction unit and transports the sample to the column, the two static probes being installed in previous and subsequent stages of the charge neutralizing means, respectively, and the metrology system is so configured that impressed voltages and voltage impression times of the plurality of electrodes may be determined using a measurement result by the static probe placed in the previous stage, and focusing of the charged particle beam is determined using a measurement result by the static probe placed in the subsequent stage.

(15) In the metrology system of fine pattern for process control by charged particle beam as set forth in the (10), mechanical arm means for wafer transportation that is inside the sample introduction unit and transports the sample to the charge neutralizing means and the surface potential measuring means.

(16) In a metrology system of fine pattern for process control by charged particle beam with the above-mentioned configuration, focusing may be corrected by feeding back to the retarding voltage a value of the surface potential of the sample measured by the surface potential measuring means before transportation of the sample to the column.

(17) In a metrology system of fine pattern for process control by charged particle beam with the above-mentioned configuration, the plurality of electrodes of the charge neutralizing means are arranged being opposed to the sample at positions with distances to the sample surface larger than the diameter of the sample.

(18) In a metrology system of fine pattern for process control by charged particle beam with the above-mentioned configuration, while the sample is charge neutralized by the charge neutralizing means, the sample is grounded or the sample is connected to an electrically conductive member grounded near the sample.

According to the present invention, it becomes possible to perform measurement and inspection of the fine pattern by the charged particle beam with high throughput.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

Hereafter, embodiments of the present invention will be described in detail based on the drawings.

First Embodiment

In a first embodiment of the present invention, a soft x-ray irradiator is installed on a transportation path of a sample and simultaneously at a position in the atmosphere, whereby regarding inspection of a charged-up sample, a measurement with the same accuracy and the same throughput as those of a non-charged up sample becomes possible.

Figure 1A:
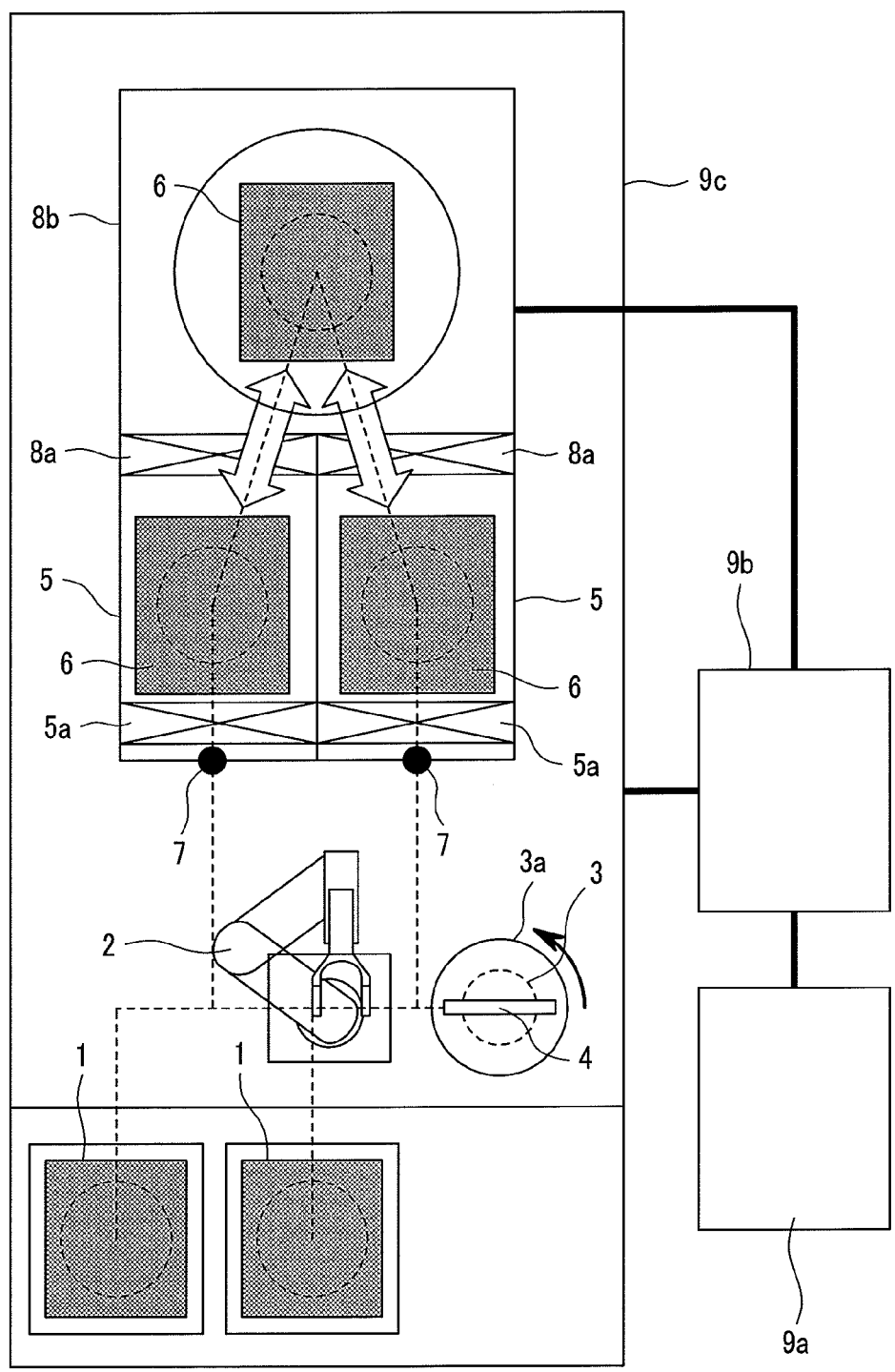
FIG. 1A is a diagram for explaining a structure of a sample introduction unit of a metrology system of fine pattern according to a first embodiment of the present invention.

FIG. 1A shows the first embodiment of the present invention, specifically showing a sample introduction unit of a metrology system of fine pattern using an electron beam. Hereafter, a metrology system will be explained by taking a semiconductor wafer being a sample as an example.

A command to inspect a predetermined wafer in the wafer cassette 1 in FOUP (Front Opening Unified Pod) or SMIF (Front Opening Unified Pod) is inputted. A predetermined wafer is automatically taken out by a mechanical arm 2 for wafer transportation of an atmosphere-side robot. In the figure, two wafer cassettes can be carried by a load board section. It is possible that these wafer cassettes can be cassettes of the same wafer size or can be cassettes of different forms. By the mechanical arm 2 for wafer transportation, the taken-out wafer is temporarily transported onto a rotation stage 3 of an aligner. Here, the notch (or orientation flat) position of the wafer 3a is detected and a position of the wafer 3a center is found.

In this embodiment, a charge neutralizer, e.g., a charge neutralizer 4 with corona discharge is supported by a support member along with the rotation stage 3, immediately above this rotation stage 3. In this embodiment, a combination of this rotation stage 3, the charge neutralizer 4, and the support member that supports them is designated as a charge neutralizer unit. A charge neutralization principal of this charge neutralizer unit uses ions generated by corona discharge. The charge neutralizer unit can generate both positive ions and negative ions necessary for charge neutralization by altering a voltage impressed on the electrode (AC pulse method). In addition, since the electrodes of the charge neutralizer 4 are arranged to form a line that is long in a one-direction as each form of the electrode, ions can be supplied so as to become uniform on the whole surface of a wafer 3a by rotating the wafer 3a with the rotation stage 3. ON/OFF of charge neutralization can be automatically operated with combination of wafer transportation and charge neutralization by inputting an ON time beforehand.

Subsequently, a gate valve 5a that isolates a load lock chamber 5 and the atmosphere is opened, and the wafer is transported from the charge neutralizer unit onto the wafer holder 6 existing in the load lock chamber 5 by the mechanical arm 2 for wafer transportation. A static probe 7 is installed in front of an inlet of the load lock chamber 5, making possible measurement of a surface potential of the wafer being transported to the load lock chamber 5. The static probe 7 partially constitutes a surface potentiometer and can measure a potential of a charged-up substance by approaching a sensor part at the end of the probe to the charged-up substance. Moreover, since the probe is so adjusted that a central part of the wafer may travel right under the sensor part of the probe at the time of wafer transportation, it can measure a charged-up potential on a diameter of the wafer including the wafer center. Therefore, it is possible to estimate a rough charge-up distribution of the transported wafer. Next, in the load lock chamber 5, the wafer holder 6 carrying the wafer transports the wafer to a predetermined position inside a sample vacuum chamber 8b of the column that is maintained vacuum and performs inspection of the sample by the electron beam via a gate valve 8a that isolates the load lock chamber 5 and the column in a vacuum.

Figure 2:
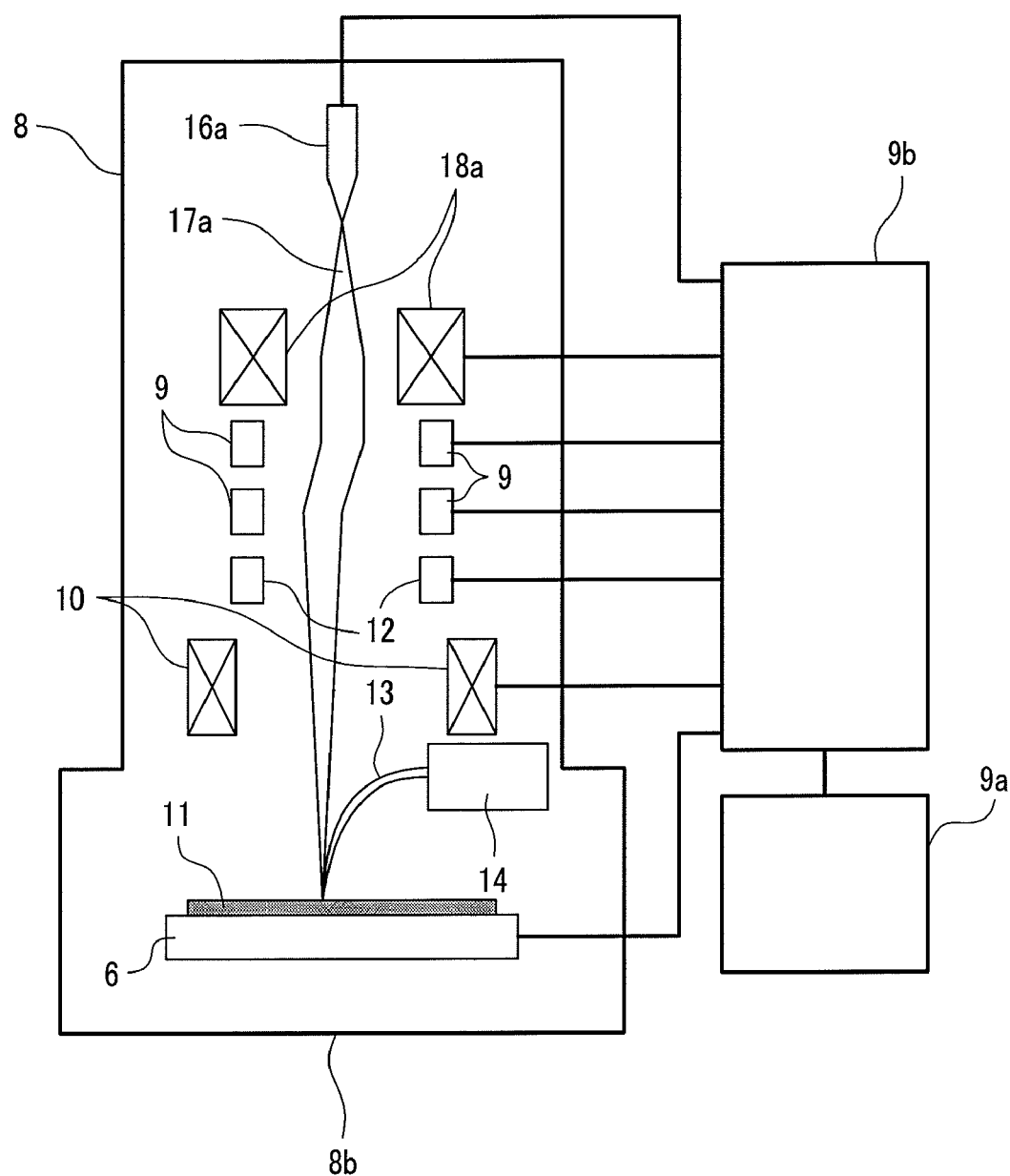
FIG. 2 is a diagram for explaining a configuration of a column of the metrology system of fine pattern using an electron beam to which the present invention is applied.

FIG. 2 shows the column of the metrology system (CD-SEM) using an electron beam to which the present invention is applied. After the sample is transported to the predetermined position inside the sample vacuum chamber as described above, a user interface/MPU 9a that is a control system of the metrology system performs automatic operations. In order to observe a wafer 11 placed on a wafer holder 6 inside the sample vacuum chamber 8b, a primary electron beam 17a emitted from the electron gun 6 is irradiated onto the sample (wafer) 11 on the wafer holder 6 via a convergent lens 18a, a deflector 9, and an objective lens 10. A retarding voltage of a predetermined value outputted from an electric power supply/control electric power 9b of the CD-SEM is impressed on the wafer holder 6 holding the wafer 11. Next, astigmatism correction of the incident beam is conducted by controlling a coil 12 for astigmatism correction.

Figure 4A:
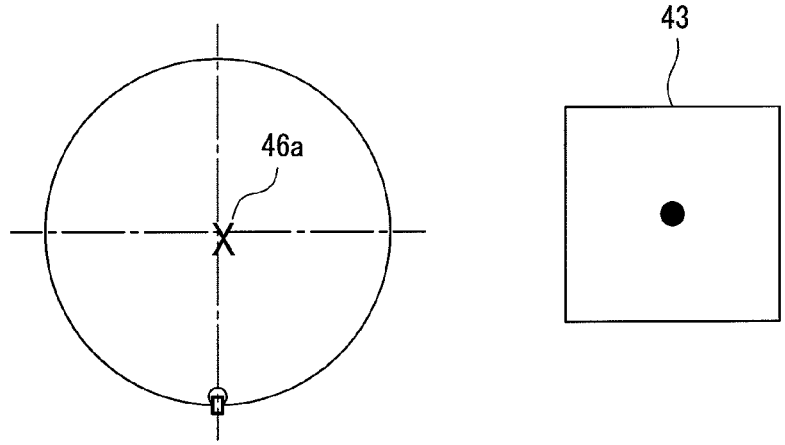
FIG. 4A is a diagram for explaining a change of the form of the electron beam on the sample by charge neutralization and an effect of the charge neutralization.
Figure 4B:
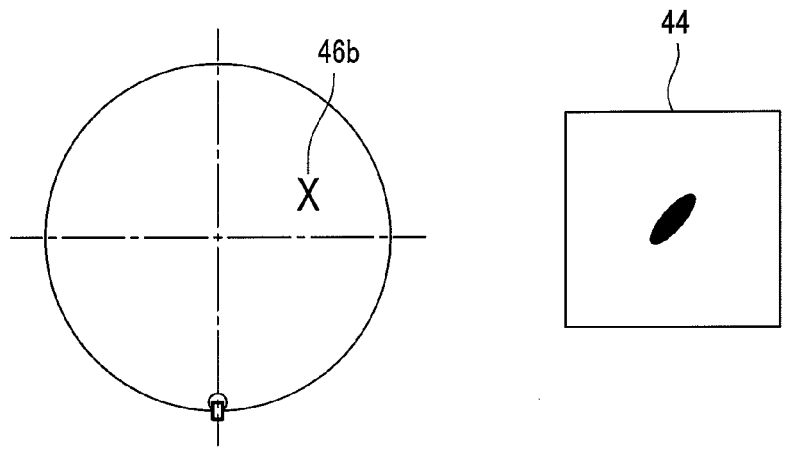
FIG. 4B is a diagram for explaining a change of the form of the electron beam on the sample by the charge neutralization and an effect of the charge neutralization.

Note here that when the wafer 11 is not charged up at all, if the astigmatism correction is conducted at a position 46a of the wafer (FIG. 4A); even when a position of irradiation on the wafer is moved to a position 46b (FIG. 4C), it is unnecessary to conduct astigmatism correction newly at the position. However, there is a case where, when the wafer is charged up, even if the shape of the beam is formed rotational symmetrical in the center of the wafer, as shown in FIG. 4A, by correcting the astigmatism there, the beam cannot be formed rotational symmetrical at positions near the edge of the wafer, remote from the wafer center, with the same amount of correction as that of the center (FIG. 4B). In this case, it is necessary to conduct astigmatism correction every time at each measurement point. Since a time required to conduct astigmatism correction for one time is about 20 seconds and the number of measurements per wafer reaches several points to a few tens of points in a normal measurement, the astigmatism correction will cause a large reduction in throughput.

Figure 4C:
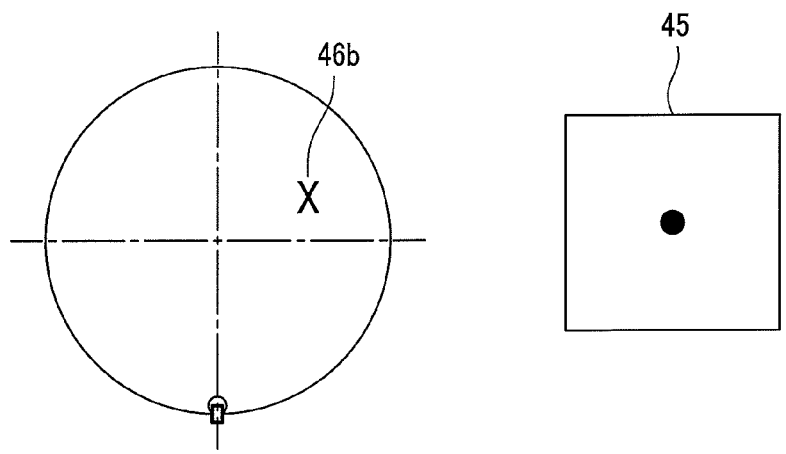
FIG. 4C is a diagram for explaining a change of the form of the electron beam on the sample by the charge neutralization and an effect of the charge neutralization.

In terms of this respect, it is determined that, as in this embodiment, the reduction in throughput is prevented by using a charge neutralization capability of the charge neutralizer 4 mounted. Provided that the wafer exists on the rotation stage and the positioning operation of the wafer using aligner capabilities is ended, the wafer is rotated to a predetermined rotational velocity. Then a switch of the charge neutralizer 4 using corona discharge is turned ON. A charge neutralization time is set to about 1 min. It is only necessary that a required time per rotation of the wafer be sufficiently small to the charge neutralization time. This charge neutralization results in charge neutralization of wafer charge-up that may affect astigmatism correction. Therefore, it becomes possible to converge a shape of the incidence beam by giving the same amount of astigmatism correction as that of the center of the wafer even at a position near the edge of the wafer, as shown in FIG. 4C. Accordingly, it becomes unnecessary to do astigmatism correction every time at each measurement point.

Next, an improvement effect for wafers such that their charge-up potential is measurable by the static probe 7 of the surface potentiometer (FIG. 1A) among charged-up wafers will also be explained.

Figure 4D:
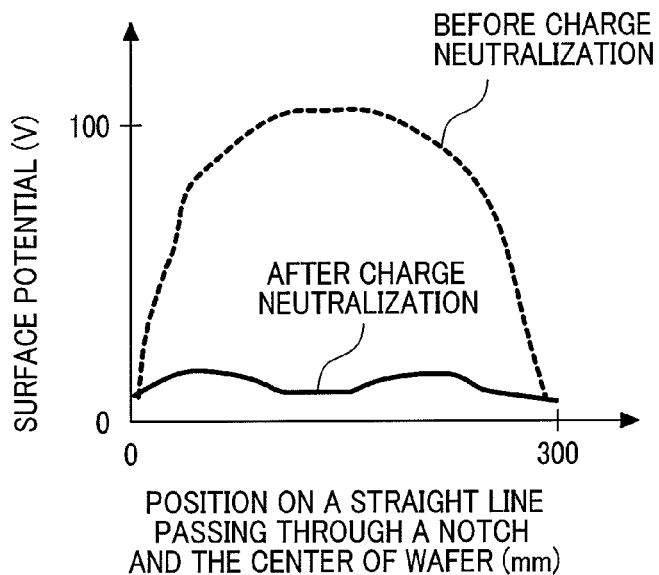
FIG. 4D is a graph for explaining a change of the form of the electron beam on the sample by the charge neutralization and an effect of the charge neutralization.

In this case, when the wafer is transported from the wafer cassette 1 to the load lock chamber 5 via the rotation stage 3, the surface potential of the wafer surface is monitored by the static probe 7. FIG. 4D shows the result. In doing this, the amount of correction for the retarding voltage is calculated from a value of the charge-up potential of the wafer surface, subsequently a voltage is varied in a rage of the corrected retarding voltage ±20 (V) to find its optimal value, a value of the retarding voltage is fixed to the optimal value, and finally a focus position is determined by conventionally practiced adjustment of the objective lens by adjusting the amount of current thereof. A subsequent procedure of finding a length measurement value of the pattern in concern is the same method as the conventional method. In this case, since potential measurement by the static probe 7 and calculation of the amount of correction of the retarding voltage are conducted during a waiting time before the wafer is measured, they do not affect the throughput.

However, a time required by setting the retarding voltage and adjusting scanning of the voltage etc. directly affects the throughput to lower it. A measurement time per measurement point, which takes five seconds conventionally for a non-charged up wafer, has deteriorated to eight seconds. Also for such a charged-up wafer, the wafer is rotated at a predetermined velocity when the wafer exists on the rotation stage 3 (FIG. 1A) and after a positioning operation of the wafer using the aligner capabilities is completed. Then, a switch of the charge neutralizer 4 using corona discharge is turned ON. The charge neutralization time was set to 90 seconds. A required time per rotation of the wafer was set to a sufficiently small value with respect to the charge neutralization time. When the wafer was transported to the load lock chamber 5 after this charge neutralization, the surface potential of the wafer after the charge neutralization was measured with the static probe 7, which gives a profile of the surface potential as "after charge neutralization" shown in FIG. 4D. All values of potential fall in a range of +15 V down to +10 V, and focusing adjustment for each potential can be done merely by adjusting the current value of the objective lens. As the throughput after charge neutralization, a time required for measurement of one point is five seconds similarly as in a non-charged up wafer.

Next, a method for installing a charge neutralizer using corona discharge in the metrology system of fine pattern using a charged particle beam will be explained.

Figure 5A:
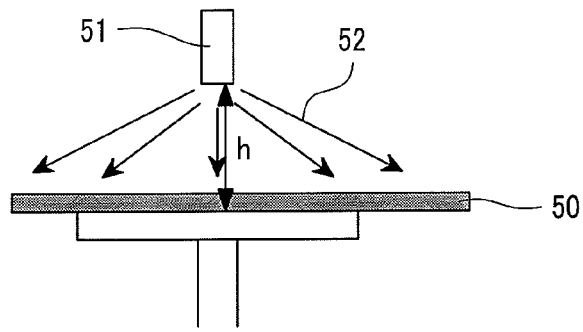
FIG. 5A is a diagram for explaining an installation method of a charge neutralizer of a soft x-ray irradiation type (hereinafter referred to as a soft x-ray irradiating charge neutralizer) in the embodiment shown in FIG. 3.

In almost all conventional charge neutralizers, if positive and negative ions generated in the electrodes of a main body of the charge neutralizer come to recombination before reaching a sample (wafer) that is a target of charge neutralization, the charge neutralization velocity becomes small. Therefore, it is necessary to take a measure of ensuring the charge neutralization velocity by decreasing a distance between the charge neutralizer and the sample or the like. Although there is a method of using ventilation by a fan etc. for ion transportation, in most cases where handling a semiconductor wafer, this methods is not adopted on fear that contamination by adhesion of particles etc. might occur. In the present invention, specifically, as shown in FIG. 5C, a value of a distance (s1) between the back side of a wafer 57 being a sample and a position of an electrode of the charge neutralizer is set to not more than a value of a radius (r1) of the wafer being a sample regarding a charge neutralizer 59 with corona discharge placed above the wafer 57 on a rotation stage 58, whereby it is possible to reduce a loss of ions generated by the charge neutralizer and attain a practical charge neutralization velocity.

In addition, the following setting is also possible: an upper limit and a lower limit of the back side potential are set up in the surface potentiometer beforehand, and if a measured value comes off a range (threshold value) defined by the upper limit and the lower limit, an alarm will be generated and displayed automatically or the wafer will be returned to the charge neutralizer unit. In that case, it is also possible to, according to a degree by which the surface potential exceeds (lowers) the upper limit and the lower limit, control the charge neutralization time in the charge neutralizer unit.

Although in this embodiment, as described above, the charge neutralizer 4 with corona discharge is placed on the rotation stage, it may be placed on any part of the transportation path of the wafer as long as the ions supplied by the charge neutralizer at the time of charge neutralization can be supplied uniformly to the whole surface of the wafer, and its installation position is not limited.

Although the neutralization method for generating corona discharge was specified to be the "AC pulse method" in this embodiment, any other discharge method can be applied to this embodiment regardless of kinds of discharge methods for generating corona discharge, such as a DC method, an AC method, and a DC pulse method. Moreover, it is known that ionization of an air molecule is promoted by irradiation of x-ray, UV light, and α-ray, which promotes charge neutralization of a charged-up substance. A charge neutralizer using this principle, e.g., a charge neutralizer of an x-ray irradiation method, a charge neutralizer of a UV light irradiation method, and a charge neutralizer of a α-ray method, are commercially available. This embodiment can be applied to these charge neutralizers. Further, in this embodiment, the charge neutralizer is not limited merely by its capability of ion generation as long as charge neutralization advances, and all types of charge neutralizers can be applied to this embodiment.

Moreover, although this embodiment was explained taking the scanning type metrology system using an electron beam, i.e., scanning electron microscope (SEM) as an example, this embodiment is not limited to this and can also be applied to other charged particle beam apparatuses, such as an other ion beam irradiator. Moreover, although this embodiment was explained for the example of detecting the secondary electron that is one of charged particles, the embodiment is not limited to this and the metrology system may be configured to detect other charged particles, e.g., a reflected electron, a secondary ion, etc.

Second Embodiment

In a second embodiment of the present invention, a soft x-ray irradiator is installed on the transportation path and in the atmosphere, whereby also regarding inspection of a charged-up sample, a measurement with the same throughput as that of the non-charged up sample becomes possible.

Figure 1B:
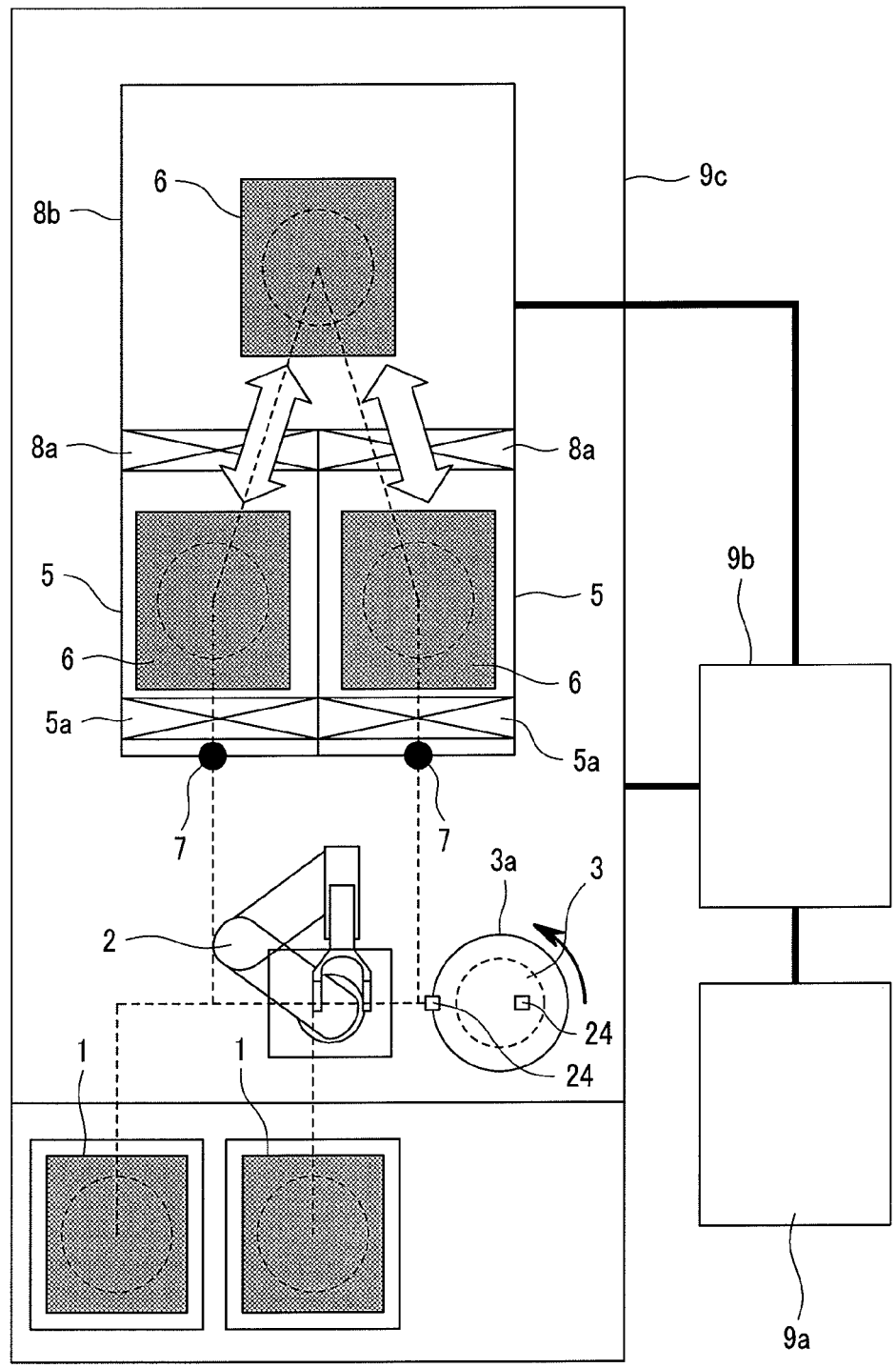
FIG. 1B is a diagram for explaining a structure of a sample introduction unit of a metrology system of fine pattern according to a second embodiment of the present invention.

FIG. 1B shows the second embodiment of the present invention, specifically showing a sample introduction unit of a metrology system of fine pattern using an electron beam. Hereafter, taking a sample of a semiconductor wafer as a sample, this embodiment will be explained.

A wafer is taken out from a wafer cassette 21 in FOUP or SMIF by a mechanical arm 22 for wafer transportation of the atmosphere-side robot. Although according to the figure, two wafer cassettes can be carried, it is possible that they are specified to be cassettes of the same wafer size or cassettes of different forms. The taken out wafer is temporarily transported to a rotation stage 23 by the mechanical arm 22 for wafer transportation. On the rotation stage 23, a position of a notch or orientation flat is detected and a center position of the wafer is found.

In this embodiment, a soft x-ray irradiating charge neutralizer 24 is installed as charge neutralizing means right above the rotation stage. The embodiment differs from the embodiment shown in FIG. 1 in this respect. When a transported wafer is charged up, this charge neutralizer is operated for a predetermined time to irradiate the soft x-ray onto the wafer. A first action of the soft x-ray is to excite air molecules in air existing in an irradiation path of the soft x-ray and thereby generate positive and negative ions. Therefore, among the positive and negative ions generated near the wafer, ions with a polarity reverse to the wafer are supplied to the wafer surface by electrostatic induction and the charged-up wafer is charge neutralized. Because of this, in a vacuum whose density of air is very small, the neutralization effect by soft x-ray irradiation is not expectable. Another action of soft x-ray is to eliminate charge up in a sample film by exciting electrons in the film.

After a wafer is positioned on the rotation stage 23 and charge neutralization is conducted, if necessary, subsequently the gate valve 5a that isolates the load lock chamber 5 from the atmosphere is opened, and the wafer is transported onto the wafer holder 6 being in the load lock chamber 5 by the mechanical arm 2 for wafer transportation. The static probe 7 is installed in front of the inlet of the load lock chamber 5, making possible measurement of the surface potential of the wafer transported to the load lock chamber 5. Since the probe is so adjusted that a central part of the wafer may travel right under a sensor part thereof at the time of wafer transportation, it can measure the charged-up potential on a diameter of the wafer including the wafer center. Therefore, a rough charge-up distribution of the transported wafer can be estimated. Next, the wafer holder 6 carrying the wafer in the load lock chamber 5 is transported to a predetermined position inside the sample vacuum chamber 8b of the column that is maintained vacuum and performs inspection of the sample by the electron beam via the gate valve 8a that isolates the load lock chamber 5 and the column in a vacuum. Subsequently, a method for obtaining length measurement values of a predetermined pattern is the same as in the case of the first embodiment of the present invention.

Figure 4E:
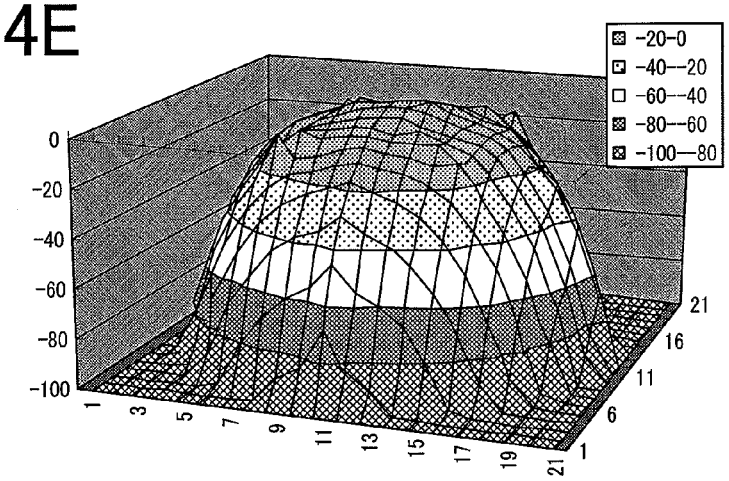
FIG. 4E is a graphical representation for explaining a change of the form of the electron beam on the sample by the charge neutralization and an effect of the charge neutralization.
Figure 4F:
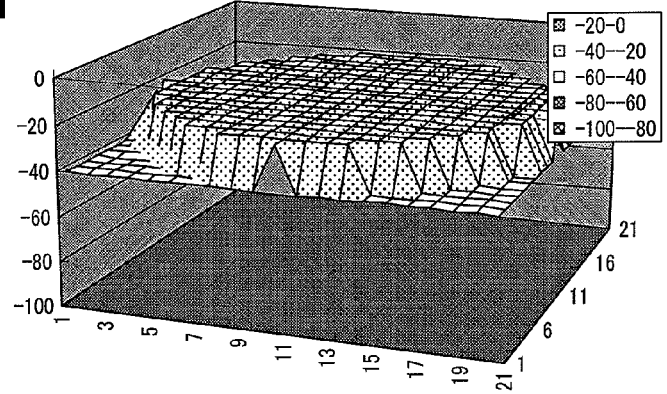
FIG. 4F is a graphical representation for explaining a change of the form of the electron beam on the sample by the charge neutralization and an effect of the charge neutralization.

Note here that there is a case where charge-up is generated on the whole surface of the wafer, as shown in FIG. 4E, and the amount of charge-up is nonuniform. Therefore, when the measurement is conducted at a plurality of different points, since the amount of charge-up is different at each measurement point by a few tens of volts, it is necessary to do coarse adjustment of the retarding voltage of the focal length every time at each measurement point. In the usual measurement, one wafer is measured at measurement points counted up to several points or a few tens of points, which will cause reduction in throughput. Here, in the case of this embodiment, the soft x-ray irradiating charge neutralizer 24 is installed on the rotation stage 3. When a charged-up wafer has come onto the rotation stage 3, charge neutralization is conducted while the wafer is being rotated. This leads the amount of charge-up of the wafer to become a uniform value on the whole surface of the wafer, as shown in FIG. 4F. Therefore, even when measurement is conducted at a plurality of different points on the wafer, it is unnecessary to do coarse adjustment of the focal length every time at each measurement point, and this embodiment was able to control the reduction in throughput to be a minimum.

Next, a method for installing a soft x-ray irradiating charge neutralizer in the metrology system of fine pattern using this electron beam will be explained.

Almost all the conventional soft x-ray irradiating charge neutralizers are each a point light source such that soft x-ray is irradiated from a certain point. Then, in the case where the charge neutralizer has a configuration (FIG. 5A) that one soft x-ray irradiator is placed above a center position of the wafer, being opposed to the wafer, the intensity of the soft x-ray that reaches the wafer surface has a distribution such that the intensity is large in the wafer center and is small near the edge of the wafer. Therefore, in order to realize an arbitrary soft x-ray intensity distribution on the wafer, the charge neutralizer needs to have a plurality of soft x-ray irradiators and one or more rotation stages, and it is necessary that heights of the soft x-ray irradiators to the sample of the soft x-ray or distances to a rotation shaft of the soft x-ray irradiators are mutually different, or both of them are mutually different.

A simplest distribution that is presumable is a case where charge-up of the wafer are almost equal everywhere in the plane of the wafer. Consideration of how to conduct uniform charge neutralization on the whole surface of the wafer with two soft x-ray irradiating charge neutralizers gave a method for installing a soft x-ray irradiating charge neutralizer 54b, which is placed at larger distance from a rotation center 55 of the rotation stage than a soft x-ray irradiating charge neutralizer 54a, nearer to a sample mount plane 53a in its perpendicular direction. The reason is the following. The soft x-ray irradiating charge neutralizer 54a placed nearer to the center position with respect to a horizontal direction of the wafer 53 than the other charge neutralizer 54b has a larger ratio of energy being able to be irradiated onto the wafer to the total generated energy. Therefore, only when a distance between itself and the wafer 53 is set larger than the other soft x-ray irradiating charge neutralizer 54b, the intensity of the soft x-ray become more uniform on the whole surface of the wafer.

Figure 5B:
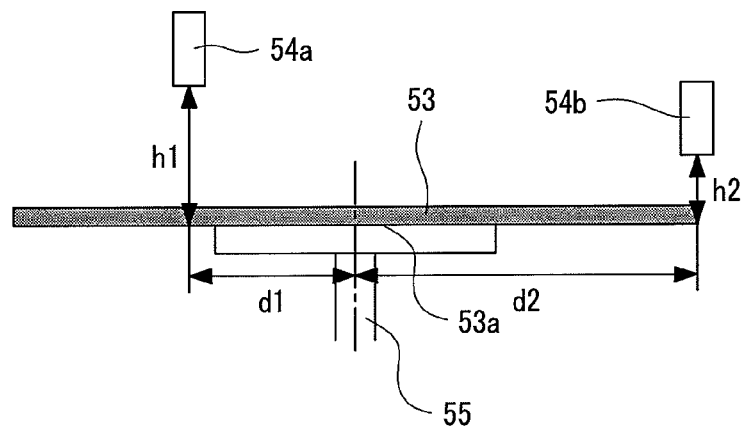
FIG. 5B is a diagram for explaining an installation method of the soft x-ray irradiating charge neutralizer in the embodiment shown in FIG. 3.
Figure 5C:
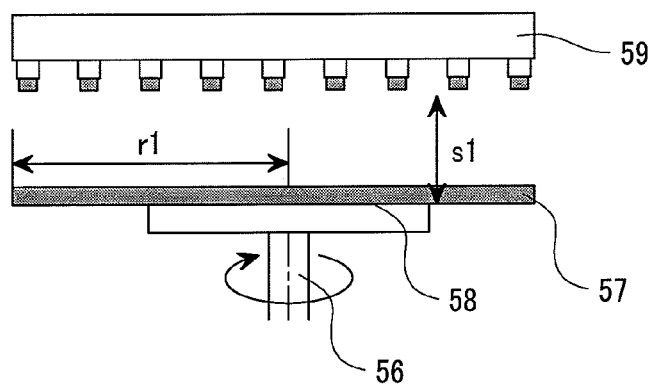
FIG. 5C is a diagram for explaining a structure of a charge neutralizer unit in the embodiment shown in FIG. 1.

In this embodiment, specifically, designating the diameter of the wafer being a sample as d, a vertical direction position of the soft x-ray irradiating charge neutralizer 54a to the sample mount plane 53a as h1, a horizontal direction position to the rotation center 55 as d1, a vertical direction position of the soft x-ray irradiating charge neutralizer 54b as h2, and a horizontal direction position as d2, the charge neutralizers 54a, 54b satisfy a geometrical configuration of (h1, d1, h2, d2)=(d/5, d/4, d/10, d/2) as shown in FIG. 5B, whereby ions can be supplied uniformly to the sample, so that uniform charge neutralization on the whole surface of the wafer can be conducted.

Figure 3:
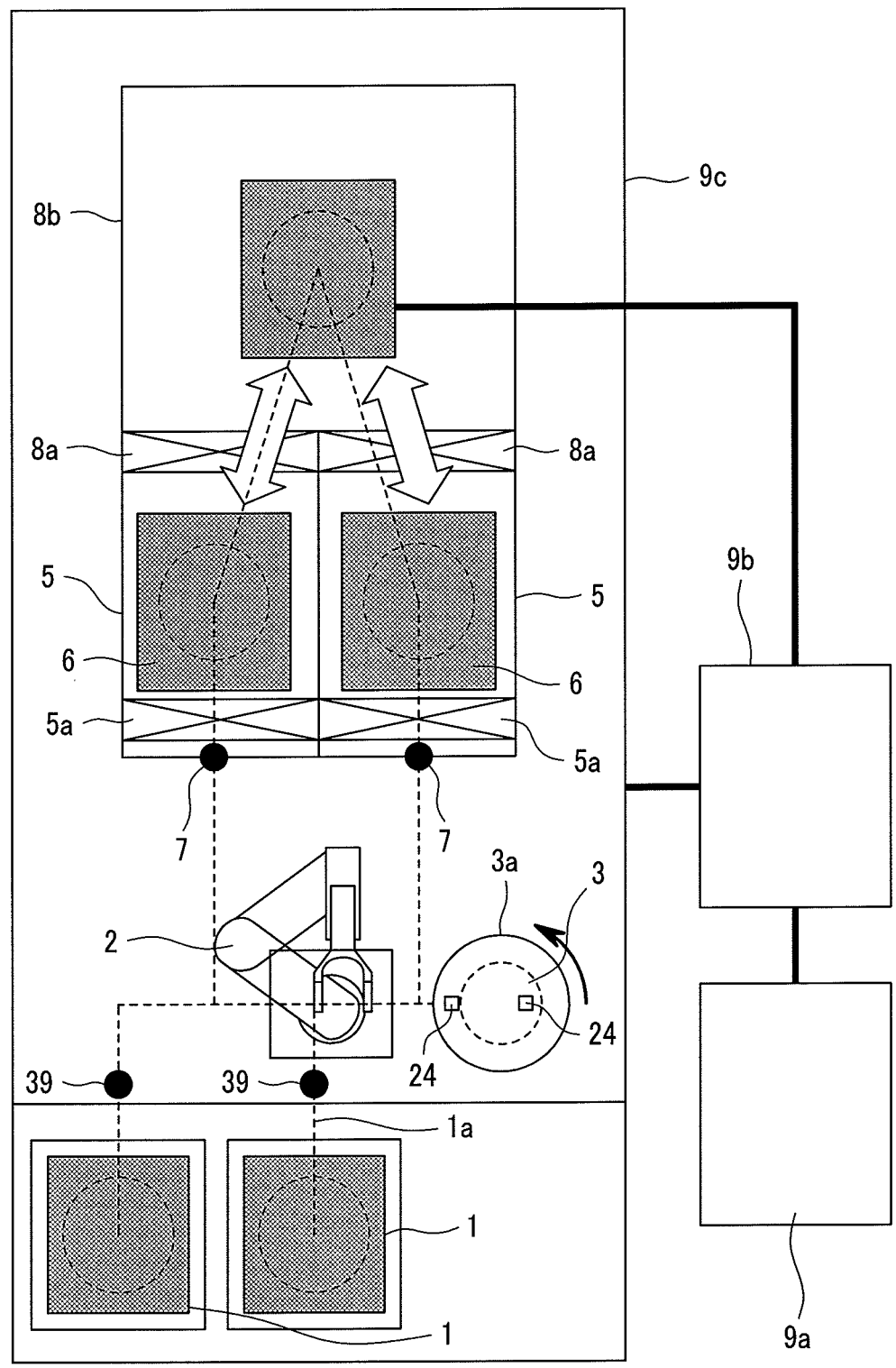
FIG. 3 is a diagram for explaining another example of structure of the sample introduction unit in the embodiment shown in FIG. 1B.

Besides the above-mentioned embodiments, if the surface potential can be measured at a stage before the charge neutralization by a soft x-ray irradiating charge neutralizer on the rotation stage, it is possible to determine an irradiation time of the soft x-ray irradiator or irradiation times of a plurality of soft x-ray irradiators individually by feeding back the result, and accordingly reduction in throughput caused by charge neutralization can be controlled to be a minimum. Specifically, as shown in FIG. 3, installation of the 2nd static probe 39 of the surface potentiometer between the wafer cassette 1 and the rotation stage 3 having a function of positioning a wafer enables the amount of charge-up measured by the static probe and a result of monitoring a charge-up distribution of the wafer to be fed back to parameter setting concerning the charge neutralization. As a result of the feedback, a necessary and sufficient charge neutralization time can be predicted, and therefore this embodiment can improve the throughput better than the conventional method. Moreover, after conducting this charge neutralization, the wafer is transported to the load lock chamber 5, and during this time, it is possible to measure the surface potential of the wafer after charge neutralization with the 1st static probe 7. The metrology system may be configured to feed back this measurement result to setting of the retarding voltage at the time of fine pattern measurement.

Although in the embodiment shown in FIG. 3, two probes, i.e., the 1st static probe 7 and the 2nd static probe 39 are shown, it is natural that one static probe is sufficient provided that the one static probe is installed right above the rotation stage 3 and this static probe has a mechanism of retracting itself at the time of charge neutralization of the soft x-ray irradiation type. This is because the surface potential before and after the charge neutralization of the wafer can be monitored.

Figure 10A:
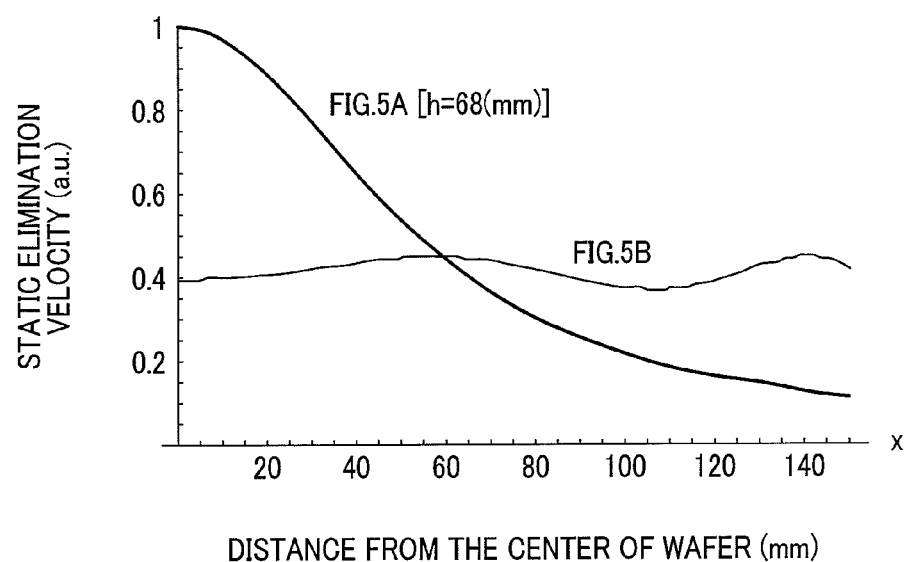
FIG. 10A is a graph showing an example of an irradiation time of the soft x-ray irradiating charge neutralizer in the second embodiment.
Figure 10B:
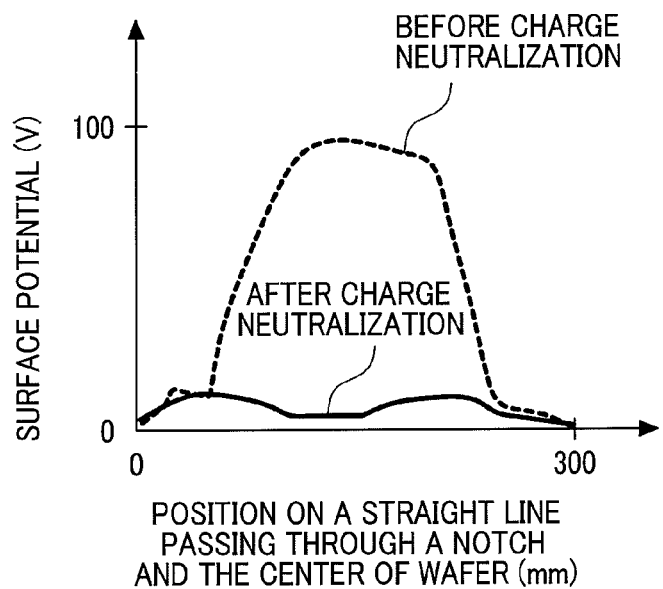
FIG. 10B is a graph showing one example of a potential distribution before and after the charge neutralization of a sample.

Although in the above, the wafer is charged up uniformly in the plane of the wafer, conversely even if the charge-up has an ununiform distribution, the wafer can be charge neutralized appropriately by controlling the charge neutralization time of a plurality of charge neutralizers based on a result obtained by monitoring the wafer with the 2nd static probe 39. For example, as shown in FIG. 10B, in the case of a wafer where charge-up is generated unevenly, i.e., distributed only in the center and its vicinity, what is recommended is that the irradiation times of the soft x-ray irradiating charge neutralizers in the center and its vicinity are increased and the irradiation times of the soft x-ray irradiating charge neutralizers installed near the edge of the wafer are decreased, as shown in FIG. 10A. By this setting, curtailment of energy and cost down of consumable supplies of the soft x-ray irradiating charge neutralizer were realized because of halting unnecessary irradiation, and annual cost of the soft x-ray irradiating charge neutralizer was able to be curtailed by 20%.

Although this embodiment was explained taking the scanning type metrology system using an electron beam, i.e., scanning electron microscope (SEM) as an example, this embodiment is not limited to this and can also be applied to other charged particle beam apparatuses, such as an other ion beam irradiator. Moreover, although this embodiment was explained taking the example of detecting the secondary electron that was one of charged particles, the embodiment is not limited to this and the metrology system may be configured to detect other charged particles, e.g., a reflected electron, a secondary ion, etc.

Third Embodiment

In a third embodiment of the present invention, one or more electrodes are arranged on the transportation path of the sample, whereby length measurement processing with an equivalent throughput to that of the non-charged up sample becomes possible even in measuring lengths of the charged-up sample.

Figure 6:
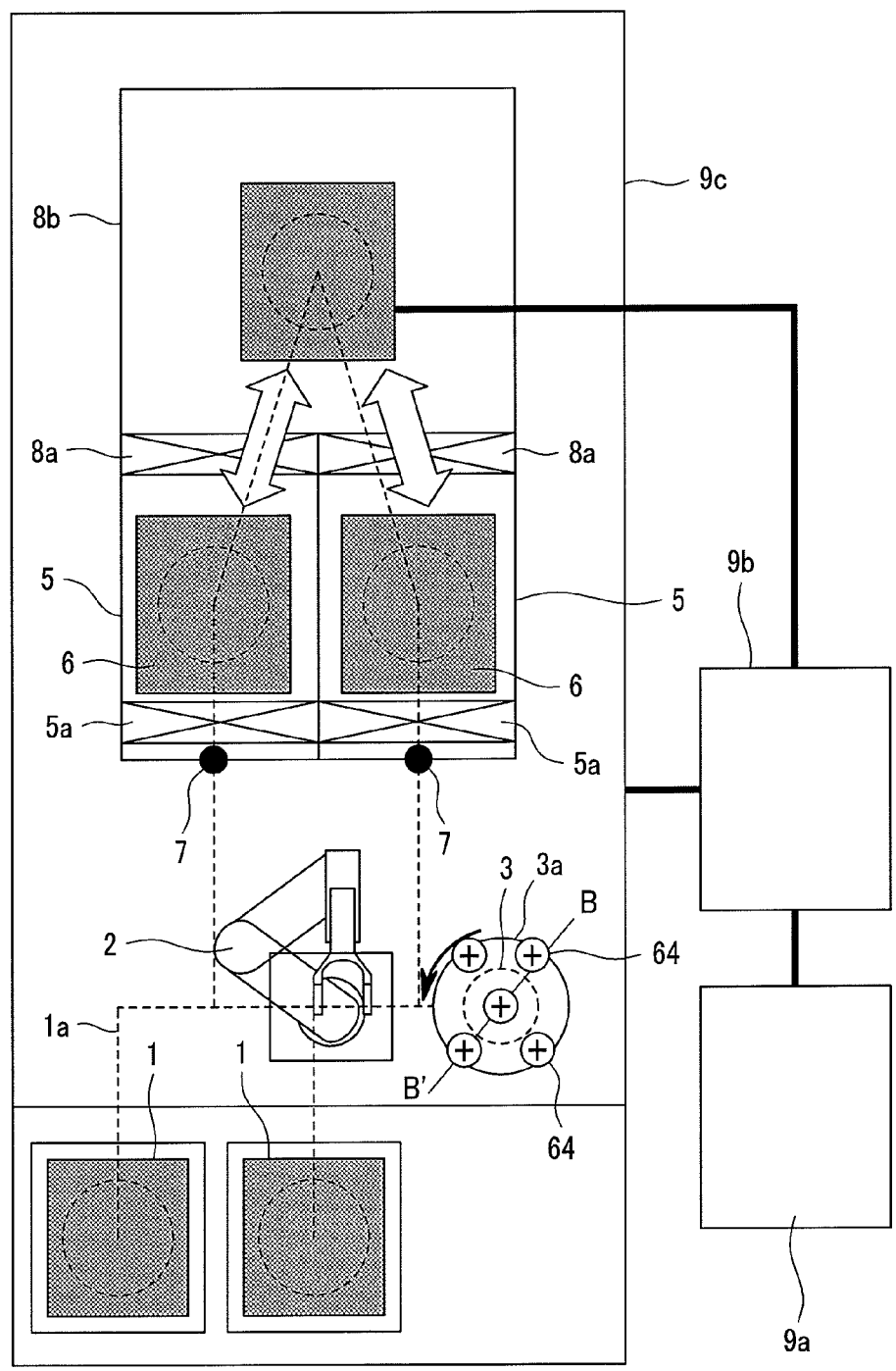
FIG. 6 is a diagram for explaining a structure of a sample introduction unit of a metrology system of fine pattern according to a third embodiment of the present invention.

FIG. 6 shows the third embodiment of the present invention, specifically showing a sample introduction unit of a metrology system using an electron beam. Hereafter, taking a semiconductor wafer as an example, the embodiment will be explained.

Like the case of the second embodiment, a wafer is taken out from the wafer cassette 1 currently kept in the FOUP or SMIF by the mechanical arm 2 for wafer transportation of the atmosphere-side robot. The taken-out wafer is temporarily transported to the rotation stage 3 by the mechanical arm 2 for wafer transportation.

In this embodiment, a plurality of electrodes 64 are arranged as charge neutralizing means right above the rotation stage 3. When the transported wafer is charged up, the charge-up wafer is charge neutralized by opposing a plurality of electrodes to which a high voltage of the order of a few kV is impressed, without discharging it, to the charged-up wafer for a predetermined time. This charge neutralization method is called a charge neutralization method of an electric-line-of-force radiation type (Reference document: Japanese Patent Application Laid Open NO. 2001-148297). Basically, when the sample intended to be charge neutralized is negatively charged up, the polarity of an electrode is set positive and the electrode is opposed to the sample. When the charge-up of the sample is positive, all that is needed is to set the polarity of the electrode being opposed to the sample negative.

After the wafer is positioned on the rotation stage 23 and charge neutralization is conducted, if needed, a gate valve 5a that isolates the load lock chamber 5 from the atmosphere is opened and the wafer is again transported onto the wafer holder 6 existing in the load lock chamber 5 by the mechanical arm 2 for wafer transportation. The static probe 7 is installed in front of the inlet of the load lock chamber 5, making possible measurement of the surface potential of the wafer transported to the load lock chamber 5. Since the probe is so adjusted that a central part of the wafer may travel right under a sensor part thereof at the time of wafer transportation, it can measure a charged-up potential on a diameter of the wafer including the wafer center. Therefore, a rough charge-up distribution of the transported wafer can be estimated. Next, the wafer holder 6 carrying the wafer on it in the load lock chamber 5 is transported to a predetermined position inside the sample vacuum chamber 8b of the column that is maintained vacuum and performs inspection of the sample by the electron beam via the gate valve 8a that isolates the load lock chamber 5 and the column in a vacuum. Subsequently, a method whereby a primary electron beam emitted from the electron gun is irradiated onto the wafer transported to the column via a convergent lens, a deflector, and an objective lens and length measurement values of a predetermined pattern are obtained is the same as in the case of the first embodiment of the present invention.

Note that in the case where a plurality of electrodes capable of being impressed a high voltage are not mounted like the conventional case, when the sample wafer is charged up and has a rotational asymmetry distribution of charge-up with respect to the position of the wafer center, since a method for estimating the surface potential of the wafer (the amount of charge-up) described in the first embodiment is predicated on rotational symmetry, its estimation error becomes large. Therefore, adjustment of the retarding voltage requires a time, which results in a decreased throughput. However, in this embodiment, since the metrology system has a plurality of electrodes each having a charge neutralization capability in it, the charge-up of the wafer can be charge neutralized. Therefore, it is unnecessary to adjust the retarding voltage, and even with the charged-up wafer, the same throughput as that of the non-charged up wafer can be secured.

There will be given an explanation about setting of an inter-electrode distance of the electrodes of the metrology system of fine pattern using an electron beam having a charge neutralization capability of an electric-line-of-force radiation type that uses a plurality of electrodes capable of being impressed this high voltage of a few kV without discharging it.

It is appropriate that the inter-electrode distances are set to a length of the order of a radius of a circular sample. The reasons are as follows: (1) Since all the electrodes are placed right above the sample, an electric power being put thereinto can be used efficiently for charge neutralization. (2) Conversely, if the sample is approached to the electrode while keeping the inter-electrode distance at a value of the radius, a distribution of a high potential of a few kV impressed on the respective electrodes is rendered more uniform with decreasing distance between the electrode and the sample at the time of charge neutralization. The reason for the above is that if the distance is too small, the high-potential distribution reaches the sample before completion of rendering the high-potential distribution sufficiently uniform, and accordingly an in-plane distribution of a charge neutralization capability becomes a distribution reflecting the arrangement of the electrodes. If such a phenomenon occurs, it is necessary to conduct charge neutralization again with the distance between the electrode and the sample increased, and accordingly it become a cause for reduction in throughput.

There will be given an explanation regarding setting of an electrode diameter of the electrode of the metrology system of fine pattern using an electron beam and having the charge neutralization capability of an electric-line-of-force radiation type that uses one or more electrodes capable of being impressed this high voltage of a few kV without discharging it.

Figure 7:
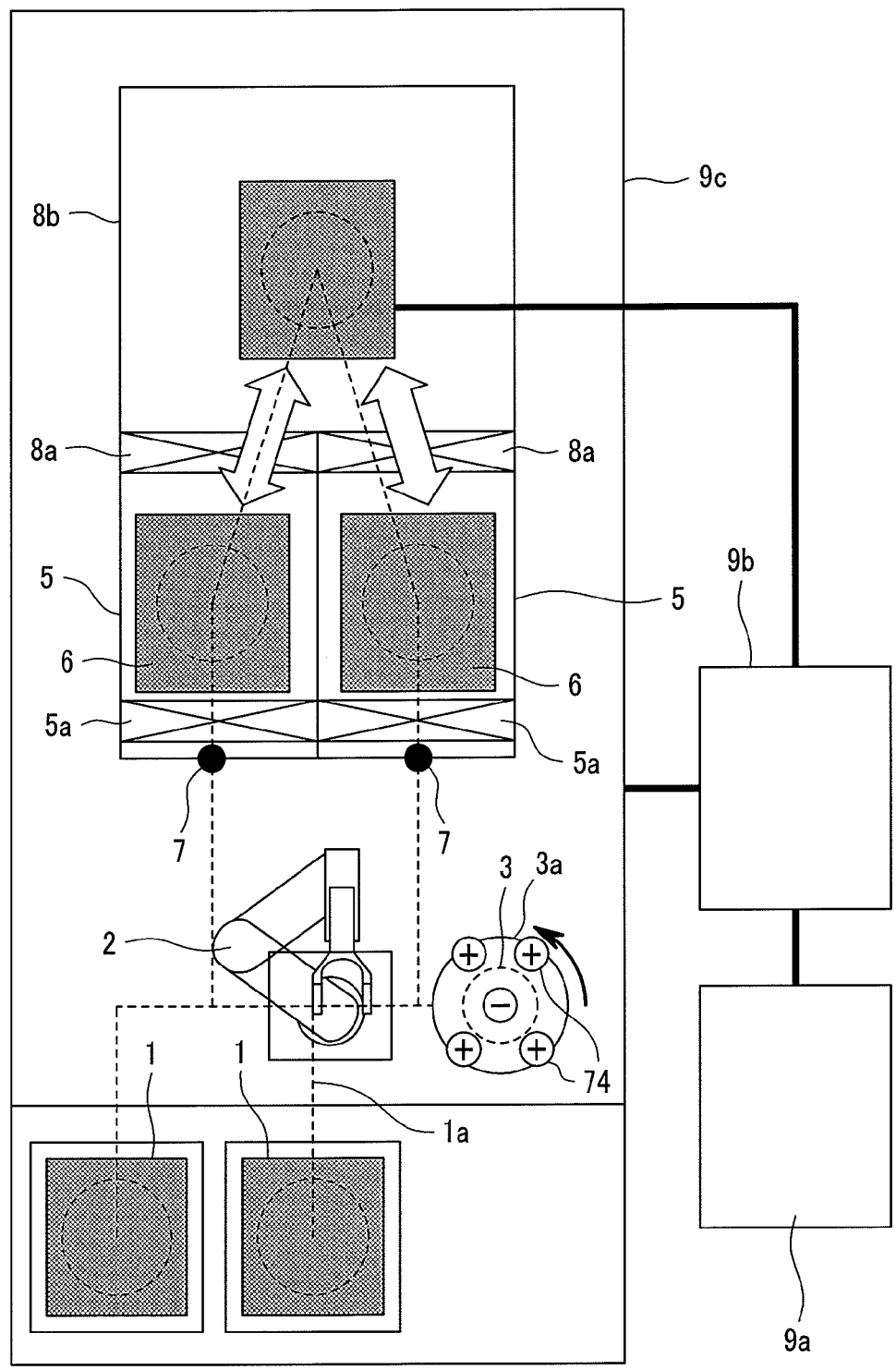
FIG. 7 is a diagram for explaining another example of structure of the sample introduction unit in the embodiment shown in FIG. 7.
Figure 11:
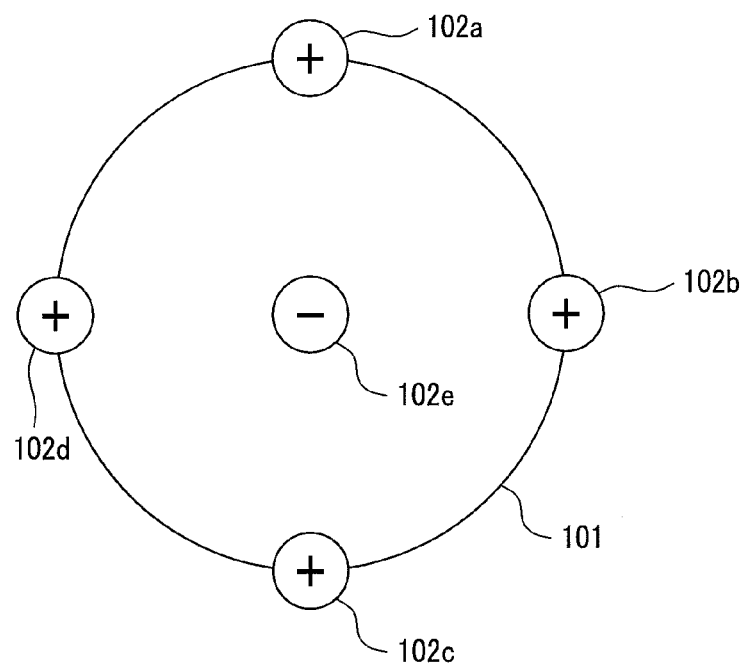
FIG. 11 is a diagram showing a configuration of arrangement of electrodes in the third embodiment of the present invention.

In the case where an object to be charge neutralized is sufficiently large in dimensions, like a 12-inch wafer whose diameter is 30 cm, a plurality of electrodes are often arranged to conduct charge neutralization. Even in this case, charge neutralization accompanied with easy potential control of the sample can be conducted by setting the polarity of some electrodes placed in the center to the reversed polarity, as shown in FIG. 7. The reason for this is that addition of the reversed polarity electrodes reduces the charge neutralization capability, and when a charge neutralization time is controlled by time control, this method can prevent charge neutralization from being impressed excessively to charge-up the wafer in the reversed polarity. Specifically, all electrodes 102a, 102b, 102C, and 102d arranged right above the peripheral part of a wafer 101 are set positive and only an electrode 102e in the central part of the wafer is set negative, as shown in FIG. 11. Before alteration of arrangement of the electrodes, two wafers out of 100 wafers were inversely charged up and needed charge neutralization again. After the alteration, when the 100 wafers are put into the process, there occurs no inversely charged-up wafer.

Moreover, there will be given an explanation regarding potential control of the sample at the time of charge neutralization in a metrology system of fine pattern with an electron beam that has a charge neutralization capability of an electric-line-of-force radiation type using one or more electrodes capable of being impressed this high voltage of a few kV without discharging it.

In the embodiments so far described, all the objects that support the wafer at the time of charge neutralization are assumed to be in floating states. On the contrary, since installation of an object for supporting the sample enlarges a ratio of electric line of force converging to the sample to electric line of force diverging from the electrode at the time of charge neutralization, the charge neutralization velocity can be made large.

Each of rotation stages 63, 73 shown in FIG. 6 and FIG. 7 generally has a mechanism of rotating a sample while it holds the sample. Use of this rotation mechanism at the time of charge neutralization can contribute to uniform charge neutralization on the whole surface of the wafer.

Figure 8:
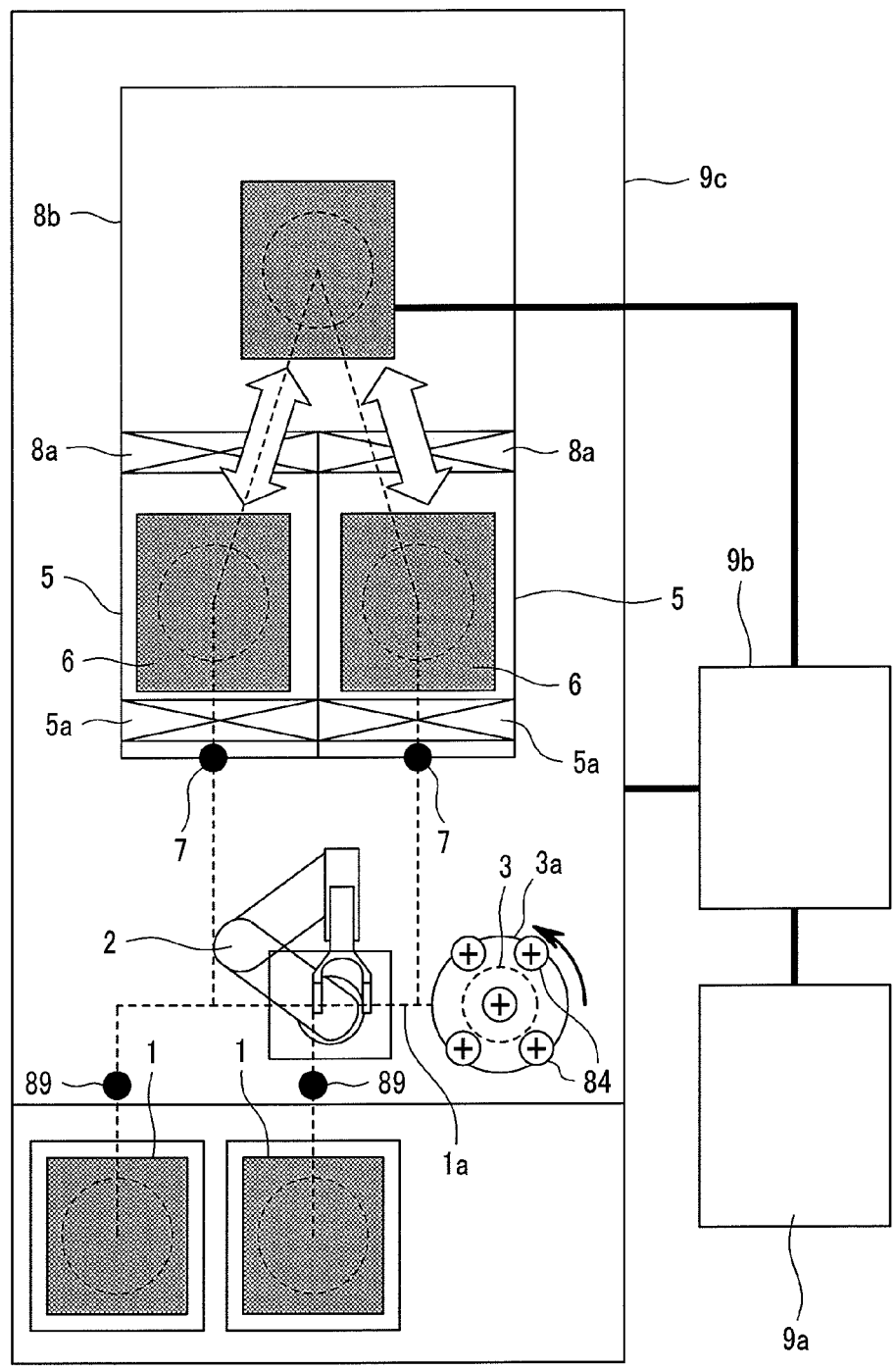
FIG. 8 is a diagram for explaining further another example of structure of the sample introduction unit in the embodiment shown in FIG. 7.
Figure 9:
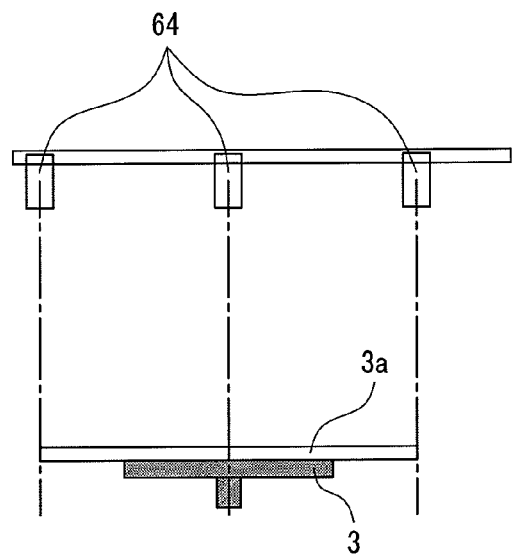
FIG. 9 is a view showing a cross-section taken along a line B-B' illustrated in FIG. 6.

The metrology system of fine pattern using an electron beam having a charge neutralizer of an electric-line-of-force radiation type that uses one or more electrode capable of being impressed this high voltage of a few kV without discharging it can have an additional function as follows: as shown in FIG. 8, if a second static probe 89 of the surface potentiometer is installed between the wafer cassette 1 and the rotation stage 3 having a function of positioning a wafer, a monitoring result of the amount of charge-up of the wafer and a charge-up distribution thereof measured by the first static probe 7 can be fed back.

This feed back enables a necessary and sufficient charge neutralization time to be predicted, and this also makes it possible to improve the throughput better than the conventional case. Moreover, since after the execution of this charge neutralization, the wafer is transported to the load lock chamber 5, the surface potential of the wafer after the charge neutralization can be measured with the 1st static probe 7 in this occasion. Therefore, the metrology system may be configured to feed back this data to the retarding voltage.

Although the embodiment shown in FIG. 8 uses the two static probes 7, 89 of the surface potentiometer shown in the figure, it is natural that only one static probe is enough, dispensing with the other one, provided that the one static probe is installed right above the rotation stage 3 and this static probe has a mechanism that enables the static probe to escape at the time of charge neutralization, which enables the surface potential of the wafer to be monitored before and after the charge neutralization.

In the above explanation, it was assumed that the wafer was charged up uniformly on the whole surface of the wafer. However, conversely in the case where charge-up has an ununiform distribution, the charge neutralization can be completed within a minimum necessary time by controlling the charge neutralization times of a plurality of charge neutralizers based on a result of monitoring it by the second static probe 89. For example, conventionally, when it is found that a wafer of a certain lot is charged up, charge neutralization is conducted over 3 min. irrespective of the magnitude of the amount of charge-up of the wafer. However, some wafers among the wafers of the lot have only one fourth times the average amount of charge-up of wafers in the lot. Therefore, a charge neutralization time that accords to the amount of charge-up of the wafers can be set from the measurement results with the second static probe 89, and accordingly a time required to charge neutralize all the wafers of the lot can be reduced to one half times the time required so far.

Although this embodiment was explained taking the scanning type metrology system using the electron beam, i.e., scanning electron microscope (SEM) as an example, this embodiment is not limited to this and can also be applied to other charged particle beam apparatuses, such as an other ion beam irradiator. Moreover, although this embodiment explained the example of detecting the secondary electron that is one of charged particles, the embodiment is not limited to this, and the metrology system may be configured to detect other charged particle, e.g., a reflected electron, a secondary ion, etc.

As described in detail above, according to the present invention, there can be realized the metrology system of fine pattern by charged particle beam capable of high-accuracy measurement with high throughput at all the measurement points in measuring and inspecting the fine pattern by the charged particle beam.

What is claimed is:

1. A metrology system of fine pattern for process control by charged particle beam, comprising:
   a column that includes a charged particle source, an electron optics for scanning a desired observation area on a sample with a charged particle beam emitted from the charged particle source, and a detector for detecting the charged particles generated secondarily from the sample scanned by the charged particle beam;
   information processing means for measuring information about geometry of a pattern formed on the sample based on information on the intensity of the charged particles obtained by the detector; and
   a sample introduction unit for introducing the sample into the inside of the column,
   wherein a charge neutralizer unit for generating ions and charge neutralizing the sample with the ions and surface potential measuring means for measuring a surface potential of the sample surface are provided on a path that is inside the sample introduction unit and transports the sample to the column, and
   wherein the metrology system is configured to correct focusing by feeding back to a retarding voltage a value of the surface potential of the sample measured by the surface potential measuring means before transportation of the sample to the column.

2. The metrology system of fine pattern for process control by charged particle beam according to claim 1,
   wherein the charge neutralizer unit has a charge neutralizer for generating ions by corona discharge and a rotation stage allowing the sample to be placed and held thereon and capable of rotation with the sample, and
   the charge neutralizer is installed to place above the rotation stage.

3. The metrology system of fine pattern for process control by charged particle beam according to claim 1,
   wherein mechanical arm means for wafer transportation that is inside the sample introduction unit and transports the sample to the rotation stage and the surface potential measuring means are provided.

4. The metrology system of fine pattern for process control by charged particle beam according to claim 2,
   wherein the charge neutralizer unit is installed at a position whose distance to the sample mount plane of the rotation stage is not more than one half times the radius of the wafer.

* * * * *